United States Patent
Kuo et al.

(10) Patent No.: US 8,436,581 B2
(45) Date of Patent: May 7, 2013

(54) SYSTEM FOR TESTING ELECTROMAGNETIC CHARACTERISTICS OF AN ELECTROMAGNETIC STEEL SHEET IN RESPONSE TO A NON-SINUSOIDAL WAVE CONTROL SIGNAL

(75) Inventors: Kai-Chen Kuo, Kaohsiung (TW); Jia-Yush Yen, Taipei (TW); Ping-Kun Lee, Kaohsiung (TW); Yi-Chih Lai, Taipei (TW); Cheng-Ju Wu, Taipei (TW)

(73) Assignee: China Steel Corporation, Kaohsiung (TW)

( * ) Notice: Subject to any disclaimer, the term of this patent is extended or adjusted under 35 U.S.C. 154(b) by 283 days.

(21) Appl. No.: 12/763,158

(22) Filed: Apr. 19, 2010

(65) Prior Publication Data

US 2010/0264911 A1      Oct. 21, 2010

(30) Foreign Application Priority Data

Apr. 21, 2009   (TW) ............................... 98113161 A

(51) Int. Cl.
*H02J 7/00*   (2006.01)
(52) U.S. Cl.
USPC ........................................................ 320/118

(58) Field of Classification Search .................... 320/118
See application file for complete search history.

(56) References Cited

U.S. PATENT DOCUMENTS

| | | | |
|---|---|---|---|
| 7,923,967 B2 * | 4/2011 | Hamaguchi et al. .......... | 320/134 |
| 2001/0020497 A1 * | 9/2001 | Kondo et al. ................ | 148/306 |
| 2007/0081368 A1 * | 4/2007 | Wai et al. ....................... | 363/98 |
| 2008/0265838 A1 * | 10/2008 | Garg et al. .................... | 320/115 |
| 2009/0121675 A1 * | 5/2009 | Ho et al. ....................... | 320/108 |

\* cited by examiner

*Primary Examiner* — Arun Williams
(74) *Attorney, Agent, or Firm* — Holland & Hart LLP

(57) ABSTRACT

A system for testing electromagnetic characteristics of an electromagnetic steel sheet includes: a driving unit operable based on a non-sinusoidal wave control signal from a control unit and a floating voltage to output a control output; a power output unit operable based on the control output from the driving unit to output a voltage output at an output side coupled across a first winding wound around the electromagnetic steel sheet such that an exciting current flowing through the first winding is generated in response to the voltage output, thereby resulting in an induced voltage across a second winding wound around the electromagnetic steel sheet; and a measuring unit outputting to the control unit an output corresponding to the exciting current and the induced voltage measured thereby such that the control unit obtains the electromagnetic characteristics of the electromagnetic steel sheet based on the output.

11 Claims, 6 Drawing Sheets

SYSTEM FOR TESTING ELECTROMAGNETIC CHARACTERISTICS OF AN ELECTROMAGNETIC STEEL SHEET IN RESPONSE TO A NON-SINUSOIDAL WAVE CONTROL SIGNAL

CROSS-REFERENCE TO RELATED APPLICATION

This application claims priority of Taiwanese Application No. 098113161, filed on Apr. 21, 2009.

BACKGROUND OF THE INVENTION

1. Field of the Invention

The invention relates to a testing system, more particularly to a system for testing electromagnetic characteristics of an electromagnetic steel sheet.

2. Description of the Related Art

FIG. 1 illustrates a conventional test system for electromagnetic characteristics of an electromagnetic steel sheet 103, i.e., a silicon steel sheet, based on a standard testing method defined by the American Society for Testing and Materials (ASTM).

The conventional test system includes a signal generating device 101 for generating a sinusoidal wave signal, and a linear power amplifier 102 coupled to the signal generating device 101 for receiving and amplifying the sinusoidal wave signal so as to output a voltage output that is applied across a first winding (N1) wound around the electromagnetic steel sheet 103 such that an exciting current flowing through the first winding (N1) is generated in response to the voltage output from the linear power amplifier 102, thereby resulting in an induced voltage across a second winding (N2) wound around the electromagnetic steel sheet 103. A wattmeter 104 and an oscilloscope 105 are used to measure the exciting current and the induced voltage. Thereafter, the electromagnetic characteristics of the electromagnetic steel sheet 103 in response to the sinusoidal wave signal can be obtained based on the exciting current and the induced voltage.

The electromagnetic steel sheet 103 is usually applied to a motor. A pulse width modulation (PWM) signal is used as a driving signal for the motor. As such, test result for the electromagnetic steel sheet 103 obtained by the conventional test system in response to the sinusoidal wave signal cannot exactly provide electromagnetic characteristics of the electromagnetic steel sheet 103 in response to a PWM signal when the electromagnetic steel sheet 103 is applied to a motor in actual use. In other words, if the signal generating device 101 generates a PWM signal rather than the sinusoidal wave signal, the PWM signal after amplifying by the linear power amplifier 102 has serious distortion. On the other hand, in another test system for an electromagnetic steel sheet with a specific specification in response to a PWM signal, a PWM amplifier is used. However, such PWM amplifier is not suitable for electromagnetic steel sheets with different specifications.

SUMMARY OF THE INVENTION

Therefore, an object of the present invention is to provide a system for testing electromagnetic characteristics of an electromagnetic steel sheet that can overcome the aforesaid drawbacks of the prior art.

According to the present invention, there is provided a system for testing electromagnetic characteristics of an electromagnetic steel sheet. The electromagnetic steel sheet is wound with a first winding and a second winding therearound. The system comprises:

a control unit operable so as to output a non-sinusoidal wave control signal;

a driving unit receiving the non-sinusoidal wave control signal from the control unit and a floating voltage, and operable based on the non-sinusoidal wave control signal and the floating voltage received thereby so as to output a control output;

a power unit operable so as to output a DC voltage;

a power output unit coupled to the power unit and the driving unit for receiving the DC voltage and the control output therefrom, and having an output side adapted to be coupled across the first winding, the power output unit being operable based on the control output and the DC voltage received thereby so as to output a voltage output at the output side such that an exciting current flowing through the first winding is generated in response to the voltage output at the output side of the power output unit, thereby resulting in an induced voltage across the second winding; and a measuring unit coupled to the control unit, adapted for measuring the exciting current flowing through the first winding and the induced voltage across the second winding, and outputting to the control unit an output corresponding to the exciting current and the induced voltage based on measurement results such that the control unit is operable based on the output from the measuring unit to obtain the electromagnetic characteristics of the electromagnetic steel sheet.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
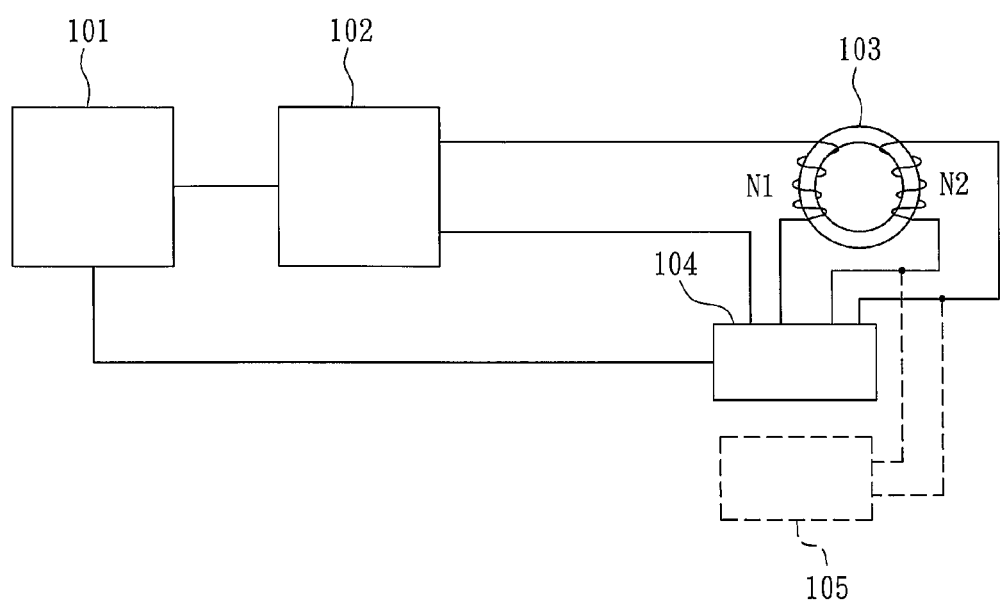
FIG. 1 is a schematic circuit block diagram of a conventional test system.
Figure 2:
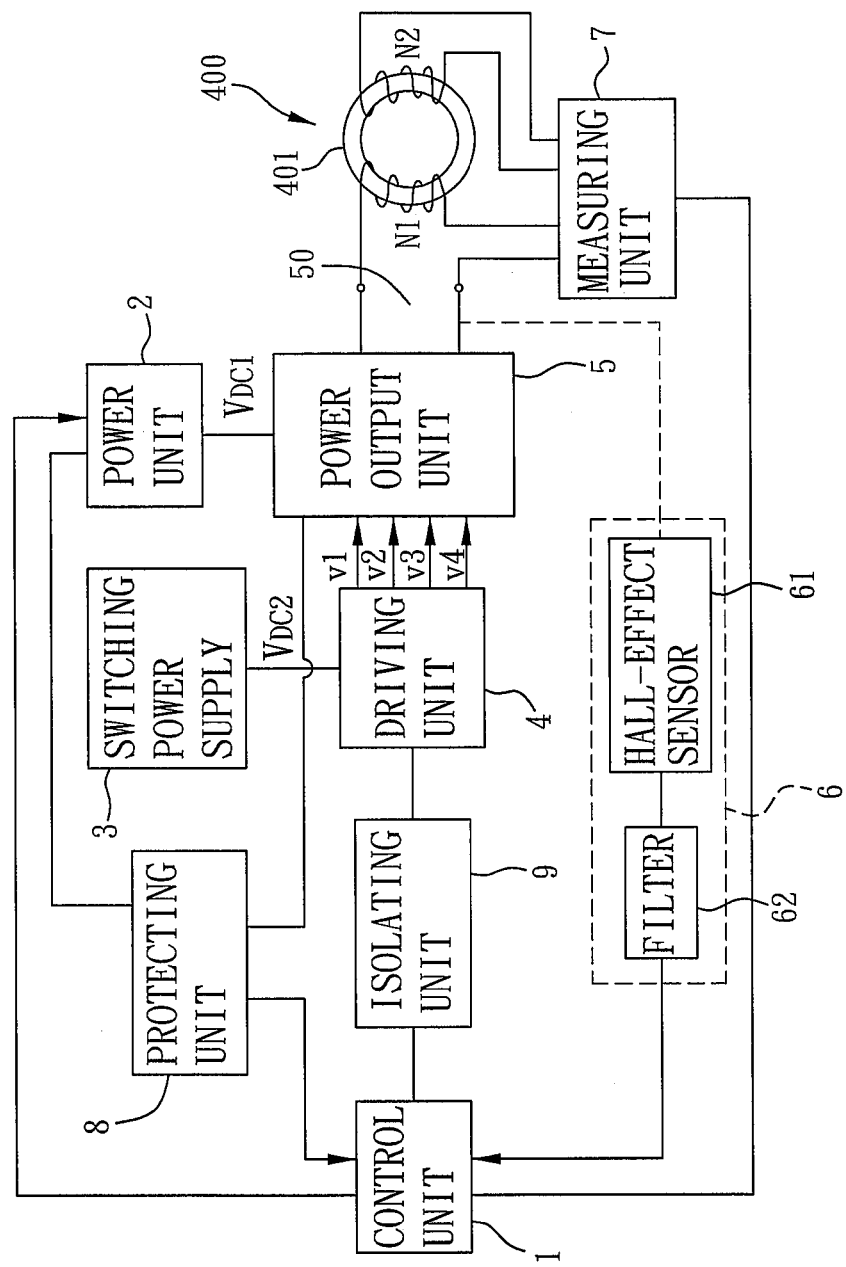
FIG. 2 is a schematic circuit block diagram illustrating the preferred embodiment of a system for testing electromagnetic characteristics of an electromagnetic steel sheet according to the present invention.

Referring to FIG. 2, the preferred embodiment of a system for testing electromagnetic characteristics of an electromagnetic steel sheet 401, such as a 50CS470 electromagnetic steel sheet, according to the present invention is shown. The electromagnetic steel sheet 401 is in the form of an annular iron core, and is wound with a first winding (N1) and a second winding (N2) therearound. In this embodiment, the electromagnetic steel sheet 401, and the first and second windings (N1, N2) constitute a tested module 400. In other embodiments, a standard tested module having a 25 cm Epstein frame can be used. The system includes a control unit 1, a switching power supply 3, a driving unit 4, a power unit 2, a power output unit 5, a measuring unit 7, a feedback unit 6, a protecting unit 8, and an isolating unit 9.

The control unit 1 is operable so as to output a non-sinusoidal wave control signal. In this embodiment, the non-sinusoidal wave control signal is a bipolar switching pulse width modulation (PWM) signal. In other embodiments, the non-sinusoidal wave control signal can be one of a unipolar switching PWM signal, a pulse amplitude modulation (PAM) signal, a triangular wave signal and a square wave signal. In this embodiment, the control unit 1 is a computer that includes an operating interface (not shown) operable to input test conditions corresponding to the electromagnetic steel sheet 401, such as types, amplitudes, frequencies and switching modes of modulation wave and carrier wave, and modulation pointer, and a digital-to-analog converter (not shown) for generating the non-sinusoidal wave control signal in the form of an analog signal based on the test conditions.

The switching power supply 3 supplies a floating DC voltage ($V_{DC2}$).

Figure 3:
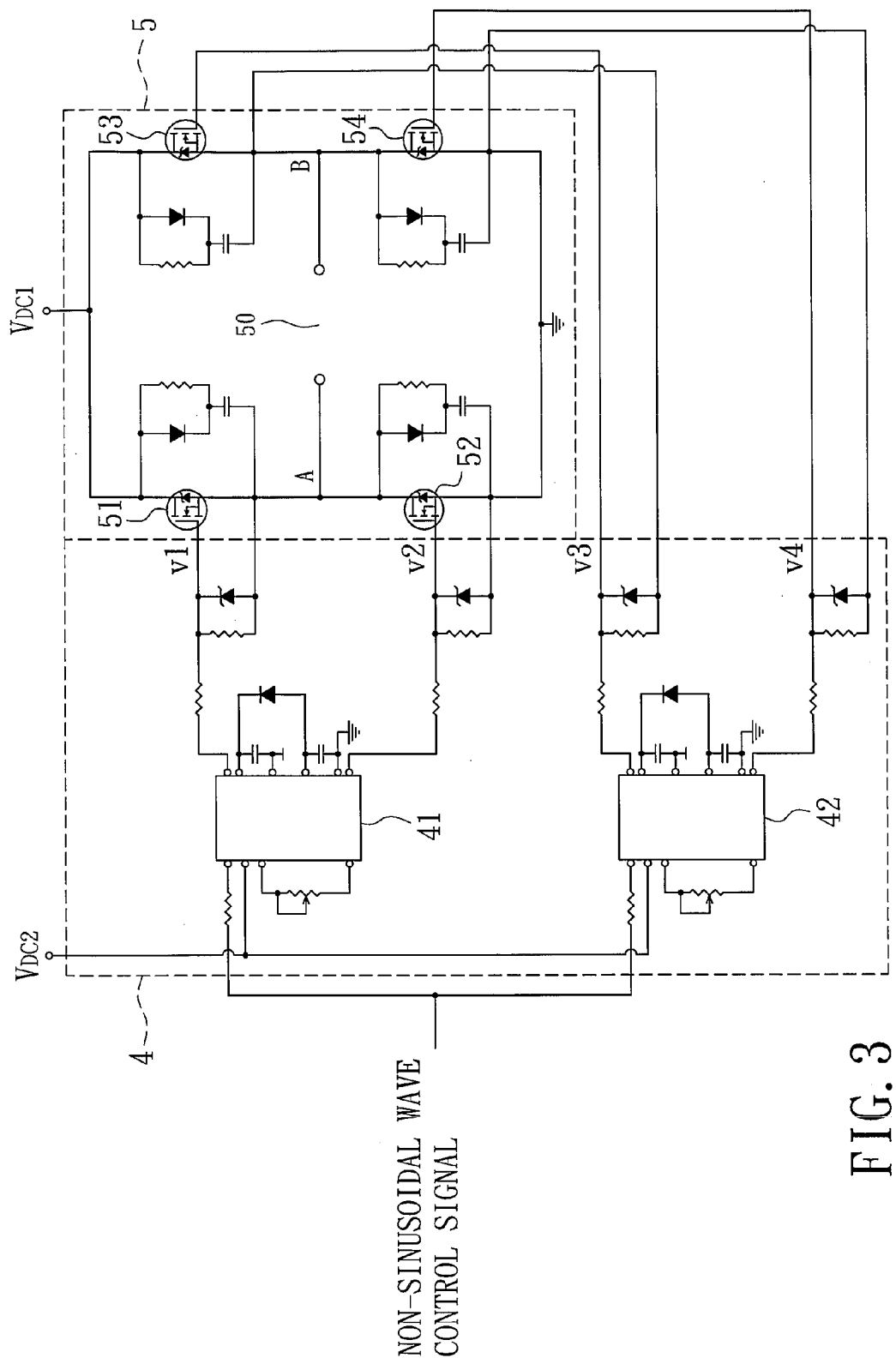
FIG. 3 is a schematic electrical circuit diagram illustrating a driving unit and a power output unit of the preferred embodiment.
Figure 4:
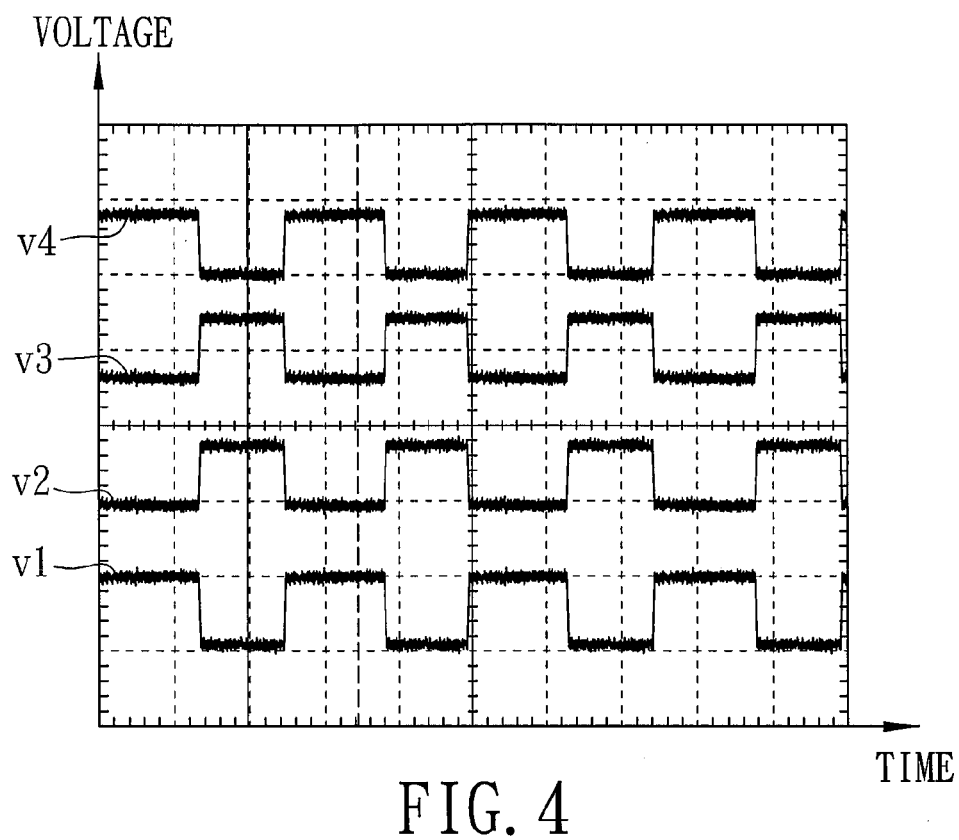
FIG. 4 illustrates waveforms of first, second, third and fourth control signals (v1, v2, v3, v4) outputted by the driving unit.
Figure 5:
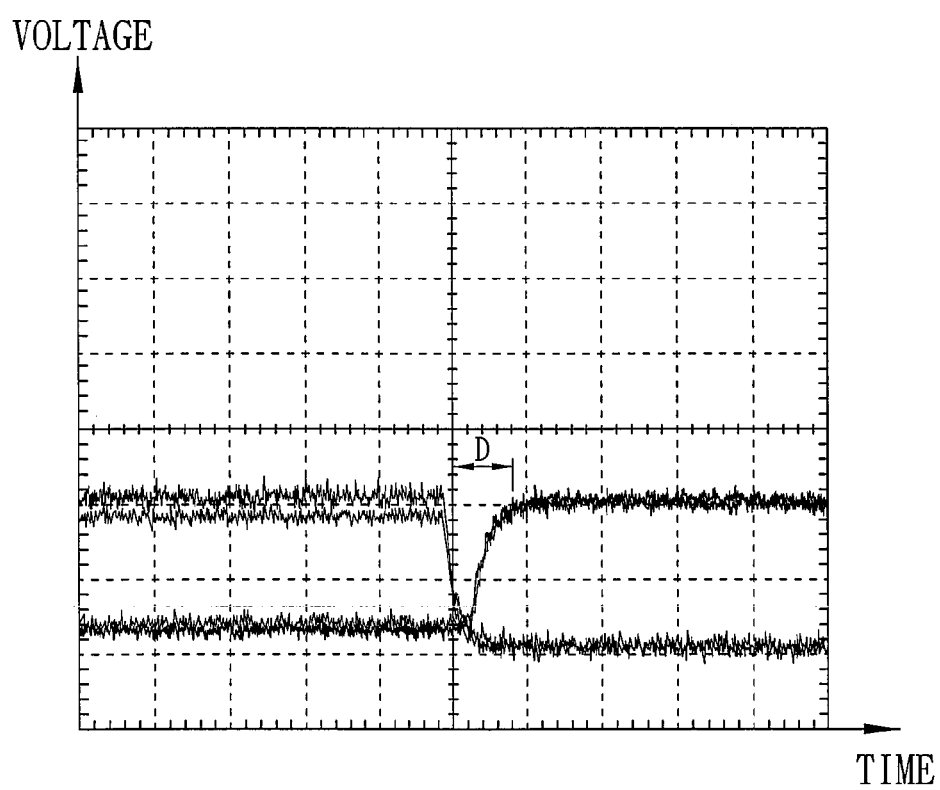
FIG. 5 illustrates a time delay during transition between low and high levels of each of the first, second, third and fourth control signals.

The driving unit 4 is coupled to the control unit 1 and the switching power supply 3 for receiving the non-sinusoidal wave control signal and the floating DC voltage ($V_{DC2}$) and is operable based on the non-sinusoidal wave control signal and the floating DC voltage ($V_{DC2}$) received thereby so as to output a control output. The control output includes first, second, third and fourth control signals (v1, v2, v3, v4). In this embodiment, referring to FIG. 3, the driving unit 4 includes a first IR21844 control chip 41 for outputting the first and second control signals (v1, v2), and a second IR21844 control chip 42 for outputting the third and fourth control signals (v3, v4). The first and fourth control signals (v1, v4) are identical to each other. As shown in FIG. 4, the second and third control signals (v2, v3) are identical to each other. The first and second control chips 41, 42 are operable to inter-latch such that each of the first and fourth control signals (v1, v4) is opposite to each of the second and third control signals (v2, v3) and that each of the first, second, third and fourth control signals (v1, v2, v3, v4) has a time delay (D) during transmission between high and low levels, as shown in FIG. 5. It is noted that the time delay (D) corresponds to the non-sinusoidal wave control signal. In other words, the time delay (D) can be adjusted by the control unit 1.

The power unit 2 is operable to output a DC voltage ($V_{DC1}$). In this embodiment, the power unit 2 is coupled to and controlled by the control unit 1 such that the DC voltage ($V_{DC1}$) outputted by the power unit 2 has a desired amplitude that conforms to a desired test mode.

The power output unit 5 is coupled to the power unit 2 and the driving unit 4 for receiving the DC voltage ($V_{DC1}$) and the control output, i.e., the first, second, third and fourth control signals (v1, v2, v3, v4), therefrom, and has an output side 50 adapted to be coupled across the first winding (N1). The power output unit 5 is operable based on the control output and the DC voltage ($V_{DC1}$) received thereby so as to output a voltage output at the output side 50 such that an exciting current flowing through the first winding (N1) is generated in response to the voltage output at the output side 50 of the power output unit 5, thereby resulting in an induced voltage across the second winding (N2). In this embodiment, as shown in FIG. 3, the power output unit 5 includes a full-bridge converter composed of a first series connection of first and second power switches 51, 52, and a second series connection of third and fourth power switches 53, 54 coupled in parallel to the first series connection of the first and second power switches 51, 52. The first and third power switches 51, 53 are coupled to the power unit 2 for receiving the DC voltage ($V_{DC1}$) therefrom. The second and fourth power switches 52, 53 are coupled to a reference node, such as ground. A first common node (A) between the first and second power switches 51, 52, and a second common node (B) between the third and fourth power switches 53, 54 constitute the output side 50 of the power output unit 5 therebetween. Each of the first, second, third and fourth power switches 51, 52, 53, 54 is a MOSFET transistor, for example, and has a control end for receiving a corresponding one of the first, second, third and fourth control signals (v1, v2, v3, v4) from the driving unit 4 such that each of the first, second, third and fourth power switches 51, 52, 53, 54 is operable between an ON-state and an OFF-state in response to the corresponding one of the first, second, third and fourth control signals (v1, v2, v3, v4). It is noted that, due to the time delay (D) of each of the first, second, third and fourth control signals (v1, v2, v3, v4), each of the first, second, third and fourth power switches 51, 52, 53, 54 can exactly switch between the ON-state and the OFF-state, and short circuit in the power output unit 5 can be prevented.

Figure 6:
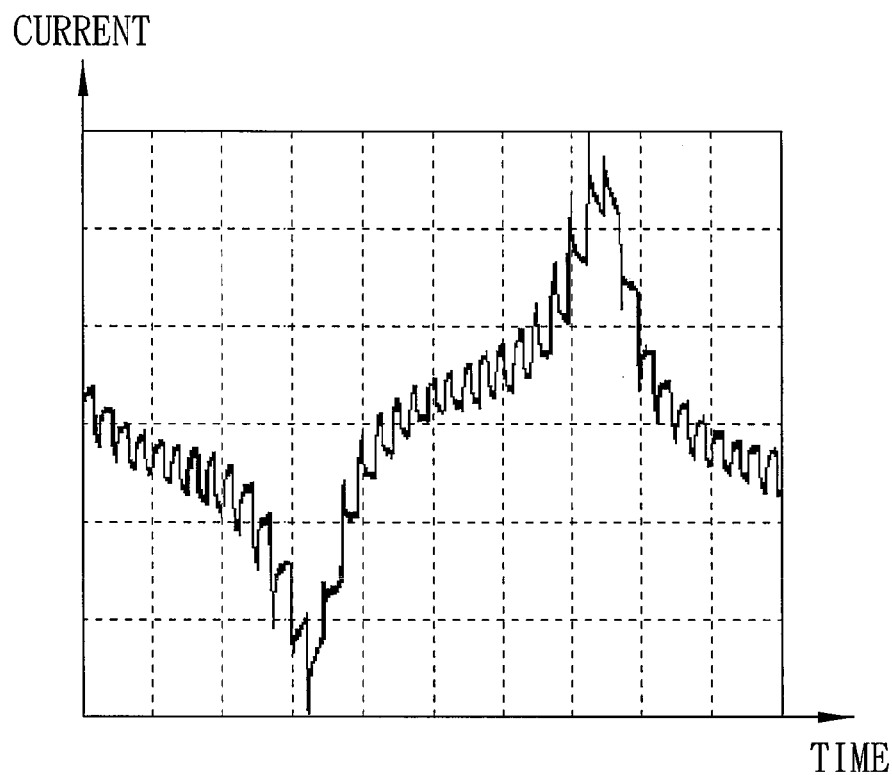
FIG. 6 illustrates a measurement result of an exciting current flowing through a first winding wound around the electromagnetic steel sheet measured by a measuring unit of the preferred embodiment.
Figure 7:
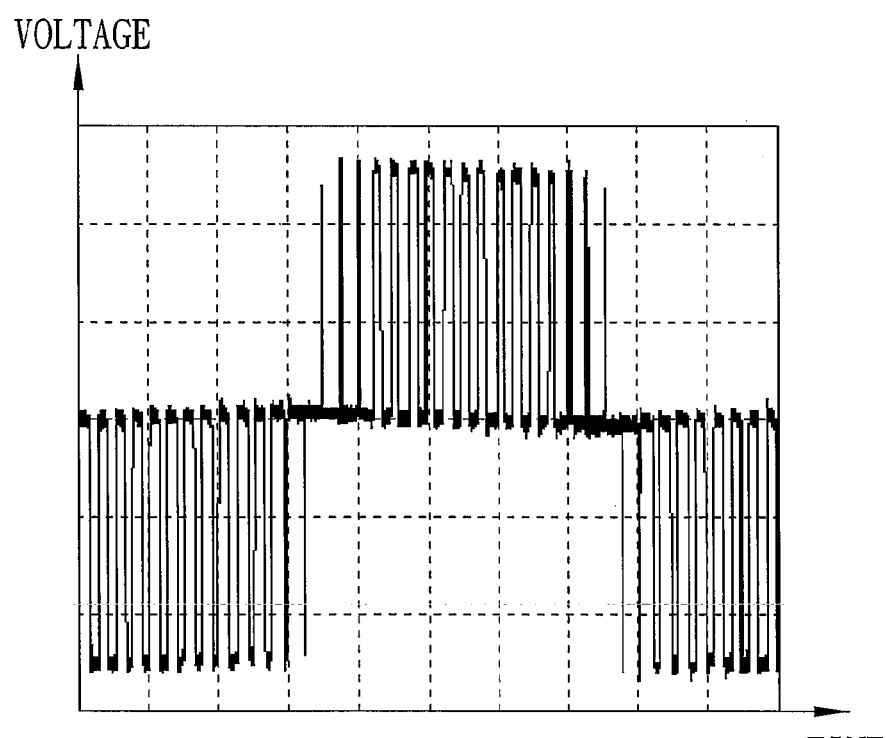
FIG. 7 illustrates a measurement result of an induced voltage across a second winding wound around the electromagnetic steel sheet measured by the measuring unit if the preferred embodiment.
Figure 8:
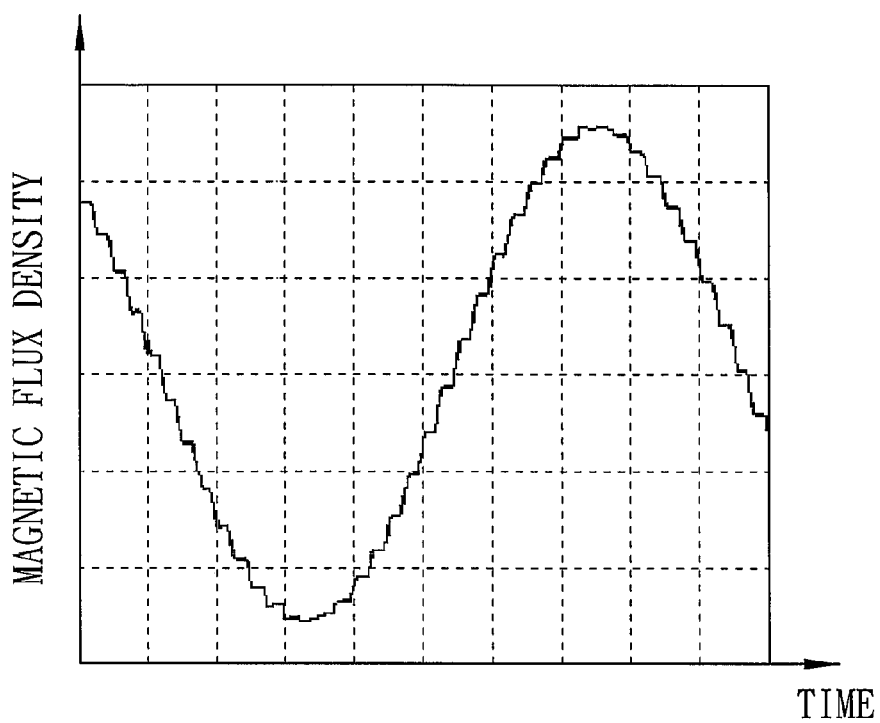
FIG. 8 is a plot illustrating magnetic flux density of the electromagnetic steel sheet obtained by the preferred embodiment.
Figure 9:
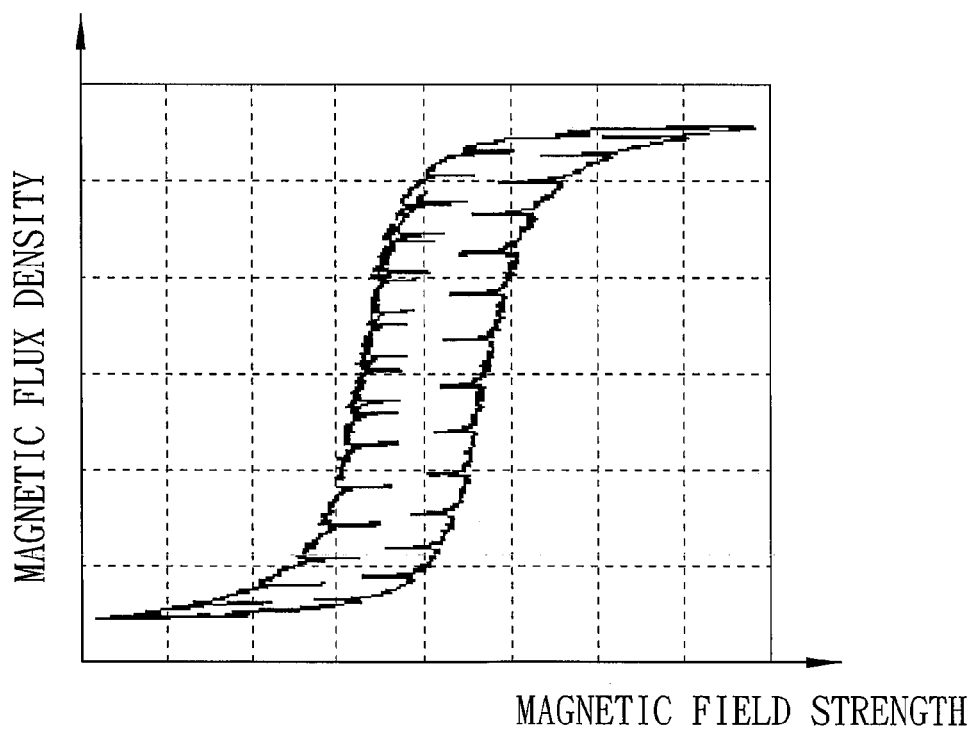
FIG. 9 illustrates a hysteresis curve of the electromagnetic steel sheet obtained by the preferred embodiment.

The measuring unit 7 is coupled to the control unit 1, and is adapted for measuring the exciting current flowing through the first winding (N1) and the induced voltage across the second winding (N2). The measuring unit 7 outputs to the control unit 1 an output corresponding to the exciting current and the induced voltage based on the measurement results such that the control unit 1 is operable based on the output from the measuring unit 7 to obtain the electromagnetic characteristics of the electromagnetic steel sheet 401. For example, in testing of the 50CS470 electromagnetic steel sheet 401 under the test conditions of a modulation wave of 60 Hz, a carrier wave of 1 KHz and a modulation point of 0.5, shown in FIG. 6 is a measurement result of the exciting current, shown in FIG. 7 is a measurement result of the induced voltage, and magnetic flux density and hysteresis curve can be obtained as shown in FIGS. 8 and 9, respectively.

The feedback unit 6 is coupled to the control unit 1, and senses a current at the output side 50 of the power output unit 5, and outputs a feedback signal indicative of the current sensed thereby to the control unit 1. In this embodiment, the feedback unit 6 includes a Hall-effect sensor 61 and a filter 62. The Hall-effect sensor 61 senses the current at the output side 50 of the power output unit 5 so as to generate a current signal. The filter 62 is coupled to the Hall-effect sensor 61 and the control unit 1, and filters the current signal from the Hall-effect sensor 61 for eliminating high-frequency noises so as to output the feedback signal to the control unit 1. As a result, the control unit 1 terminates output of the non-sinusoidal wave control signal upon detecting that the current at the output side 50 of the power output unit 5 is greater than a threshold current based on the feedback signal from the feedback unit 6 for safety purposes, thereby avoiding overload of the system. Furthermore, iron loss of the electromagnetic steel sheet 401 is associated with the feedback signal from the feedback unit 6.

The isolating unit 9 is coupled to the control unit 1 and the driving unit 4 for isolating high frequency noises generated upon switching of the first, second third and fourth power switches 51, 52, 53, 54 of the power output unit 5 from the control unit 1, thereby minimizing damage and interference resulting from high frequency noises to the control unit 1. In this embodiment, the isolating unit 9 includes an optical coupler.

The protecting unit 8 is coupled to the control unit 1, the power output unit 5 and the power unit 2, detecting the power unit 2 and the power output unit 5, and outputs to the control unit 1 a first protecting signal upon detecting that the DC voltage generated by the power unit 2 is greater than a threshold voltage, and a second protecting signal upon detecting that the temperature of the power output unit 5 is higher than a threshold temperature such that the control unit 1 controls the power unit 2 to terminate output of the DC voltage ($V_{DC1}$) upon receipt of the first protecting signal from the protecting unit 8, and terminates output of the non-sinusoidal wave control signal upon receipt of the second protecting signal from the protecting unit 8.

In sum, the system of the present invention can test electromagnetic characteristics of the electromagnetic steel sheet 401 in response to the non-sinusoidal wave control signal. Furthermore, the control unit 1 is operable to adjust the non-sinusoidal wave control signal outputted thereby and the DC voltage ($V_{DC1}$) supplied by the power unit 2 based on the test conditions corresponding to the electromagnetic steel sheet 401 with different type and specification, thereby enhancing test applicability.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A system for testing electromagnetic characteristics of an electromagnetic steel sheet, the electromagnetic steel sheet being wound with a first winding and a second winding therearound, said system comprising:
    a control unit operable so as to output a non-sinusoidal wave control signal;
    a driving unit receiving the non-sinusoidal wave control signal from said control unit and a floating voltage, and operable based on the non-sinusoidal wave control signal and the floating voltage received thereby so as to output a control output;
    a power unit operable so as to output a DC voltage;
    a power output unit coupled to said power unit and said driving unit for receiving the DC voltage and the control output therefrom, and having an output side adapted to be coupled across the first winding, said power output unit being operable based on the control output and the DC voltage received thereby so as to output a voltage output at said output side such that an exciting current flowing through the first winding is generated in response to the voltage output at said output side of said power output unit, thereby resulting in an induced voltage across the second winding; and
    a measuring unit coupled to said control unit, adapted for measuring the exciting current flowing through the first winding and the induced voltage across the second winding, and outputting to said control unit an output corresponding to the exciting current and the induced voltage based on measurement results such that said control unit is operable based on the output from said measuring unit to obtain the electromagnetic characteristics of the electromagnetic steel sheet.

2. The system as claimed in claim 1, wherein the non-sinusoidal wave control signal is one of a unipolar switching pulse width modulation signal, a bipolar switching pulse width modulation signal, a pulse amplitude modulation signal, a triangular wave signal and a square wave signal.

3. The system as claimed in claim 1, further comprising a feedback unit coupled to said control unit, sensing a current at said output side of said power output unit, and outputting a feedback signal indicative of the current sensed thereby to said control unit;
    wherein said control unit terminates output of the non-sinusoidal wave control signal upon detecting that the current at said output side of said power output unit is greater than a threshold current based on the feedback signal from said feedback unit.

4. The system as claimed in claim 3, wherein said feedback unit includes a Hall-effect sensor for sensing the current at the output side of said power output unit so as to generate a current signal.

5. The system as claimed in claim 4, wherein said feedback unit further includes a filter coupled to said Hall-effect sensor and said control unit, and filtering the current signal from said Hall-effect sensor so as to output the feedback signal to said control unit.

6. The system as claimed in claim 1 wherein:
    said power output unit includes a full-bridge converter composed of a first series connection of first and second power switches, and a second series connection of third and fourth power switches coupled in parallel to the first series connection of said first and second power switches, said first and third power switches being coupled to said power unit for receiving the DC voltage therefrom, said second and fourth power switches being coupled to a reference node, a first common node between said first and third power switches, and a second common node between said third and fourth power switches constituting said output side of said power output unit therebetween, each of said first, second, third and fourth power switches having a control end; and
    said control output outputted by said driving unit includes first, second, third and fourth control signals received respectively by said control ends of said first, second, third and fourth power switches of said power output unit such that each of said first, second, third and fourth power switches is operable between an ON-state and an OFF-state in response to a corresponding one of the first, second, third and fourth control signals, the first and fourth control signals being identical to each other, the second and third control signals being identical to each other, each of the first and fourth control signals being opposite to each of the second and third control signals, each of the first, second, third and fourth control signals having a time delay corresponding to the non-sinusoidal wave control signal during transition between high and low levels.

7. The system as claimed in claim 6, further comprising a switching power supply coupled to said driving unit for supplying the floating voltage thereto.

8. The system as claimed in claim 1, further comprising an isolating unit coupled between the driving unit and said control unit for isolating high frequency noises from said control unit.

9. The system as claimed in claim 8, wherein said isolating unit includes an optical coupler.

10. The system as claimed in claim 1, wherein said power unit is coupled to and controlled by said control unit such that the DC voltage outputted by said power unit has a desired amplitude.

11. The system as claimed in claim 10, further comprising a protecting unit coupled to said control unit, said power output unit and said power unit, detecting said power unit and said power output unit, and outputting to said control unit a first protecting signal upon detecting that the DC voltage generated by the power unit is greater than a threshold voltage, and a second protecting signal upon detecting that the temperature of said power output unit is higher than a threshold temperature such that said control unit controls said power unit to terminate output of the DC voltage upon receipt of the first protecting signal from said protecting unit, and terminates output of the non-sinusoidal wave control signal upon receipt of the second protecting signal from said protecting unit.

* * * * *